United States Patent
Fitzsimmons et al.

(10) Patent No.: US 8,835,326 B2
(45) Date of Patent: Sep. 16, 2014

(54) TITANIUM-NITRIDE REMOVAL

(75) Inventors: John A. Fitzsimmons, Poughkeepsie, NY (US); Shyng-Tsong Chen, Rensselaer, NY (US); David L. Rath, Stormville, NY (US); Muthumanickam Sankarapandian, Niskayuna, NY (US); Oscar van der Straten, Mohegan Lake, NY (US)

(73) Assignee: International Business Machines Corporation, Armonk, NY (US)

( * ) Notice: Subject to any disclaimer, the term of this patent is extended or adjusted under 35 U.S.C. 154(b) by 193 days.

(21) Appl. No.: 13/343,190

(22) Filed: Jan. 4, 2012

(65) Prior Publication Data

US 2013/0171829 A1   Jul. 4, 2013

(51) Int. Cl.
*H01L 21/3065* (2006.01)
*H01L 21/3213* (2006.01)
*H01L 21/02* (2006.01)

(52) U.S. Cl.
CPC .... *H01L 21/32134* (2013.01); *H01L 21/02063* (2013.01)
USPC ................ 438/712; 438/653; 257/E21.218; 510/175

(58) Field of Classification Search
CPC ................ H01L 21/02063; H01L 21/32134; H01L 21/31144; H01L 21/3065
USPC ............ 438/712, 653; 257/E21.218; 510/175
See application file for complete search history.

(56) References Cited

U.S. PATENT DOCUMENTS

| 4,804,636 | A | 2/1989 | Groover, III et al. |
| 6,200,910 | B1 | 3/2001 | O'Brien et al. |
| 6,379,577 | B2 | 4/2002 | Akatsu et al. |
| 6,686,275 | B2 | 2/2004 | Chen et al. |
| 7,922,824 | B2 | 4/2011 | Minsek et al. |
| 2006/0027924 | A1* | 2/2006 | Chen et al. ................... 257/751 |
| 2006/0117667 | A1 | 6/2006 | Siddiqui et al. |
| 2006/0226122 | A1 | 10/2006 | Wojtczak |
| 2009/0082240 | A1* | 3/2009 | Nukui et al. ................. 510/176 |

OTHER PUBLICATIONS

S.-T. Chen et al., "64 nm pitch Cu Dual-Damascene Interconnects using Pitch Split Double Exposure Patterning Scheme," IEEE International Interconnect Technology Conference (IITC), May 8-12, 2011, 2011, Session 8.3, 3 pages.

C.-H. Lee et al., "Crystallographic Structures and Parasitic Resistances of Self-Aligned Silicide TiSi2/Self-Aligned Nitrided Barrier Layer/Selective Chemical Vapor Deposited Aluminum in Fully Self-Aligned Metallization Metal Oxide Semiconductor Field-Effect Transistor," Jpn. J. Appl. Phys., vol. 38, 1999, pp. 5835-5838.

S. L. Cheng et al., "Formation of C54—TiSi2 in titanium on nitrogen-ion-implanted (001)Si with a thin interposing Mo layer," J. Mater. Res., vol. 14, No. 5, May 1999, pp. 2061-2069.

* cited by examiner

*Primary Examiner* — Nadine Norton
*Assistant Examiner* — Mahmoud Dahimene
(74) *Attorney, Agent, or Firm* — Scully, Scott, Murphy & Presser, P.C.; Catherine Ivers

(57) ABSTRACT

A chemical solution that removes undesired metal hard mask yet remains selective to the device wiring metallurgy and dielectric materials. The present invention decreases aspect ratio by selective removal of the metal hard mask before the metallization of the receiving structures without adverse damage to any existing metal or dielectric materials required to define the semiconductor device, e.g. copper metallurgy or device dielectric. Thus, an improved aspect ratio for metal fill without introducing any excessive trapezoidal cross-sectional character to the defined metal receiving structures of the device will result.

22 Claims, 13 Drawing Sheets

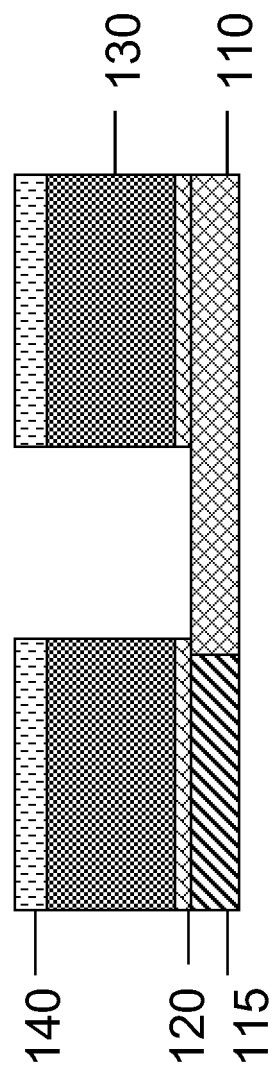

TITANIUM-NITRIDE REMOVAL

BACKGROUND OF THE INVENTION

1. Field of the Invention

The present invention relates to removal of metal hard mask materials for microelectronic devices. More particularly, the present invention relates to a chemical solution for removing metal hard mask selective to device wiring and dielectric materials.

2. Description of the Related Art

Interconnect circuitry in semiconductor circuits consists of conductive metallic circuitry surrounded by insulating dielectric material. Silicate glass vapor deposited from tetraethylorthosilicate (TEOS) was widely used as the dielectric material, while alloys of aluminum were used for metallic interconnects.

Demand for higher processing speeds has led to smaller sizing of circuit elements, along with the replacement of TEOS and aluminum alloys by higher performance materials. Aluminum alloys have been replaced by copper or copper alloys due to the higher conductivity of copper. TEOS and fluorinated silicate glass (FSG) have been replaced by the so called low-k dielectrics, including low-polarity materials such as organic polymers, hybrid organic, inorganic materials, organosilicate glass (OSG), and carbon-doped oxide (CDO) glass. The incorporation of porosity, i.e. air-filled pores, in these materials further lowers the dielectric constant of the material.

During dual-damascene processing of integrated circuits, photolithography is used to image a pattern on a device wafer. Photolithography techniques comprise the steps of coating, exposure and development. A wafer is coated with a positive or negative photoresist substance and subsequently covered with a mask that defines patterns to be retained or removed in subsequent processes. Following the proper positioning of the mask, the mask has directed there through a beam of monochromatic radiation, such as ultraviolet (UV) light or deep UV (DUV) light (~250 nm or 193 nm), to make the exposed photoresist material more or less soluble in a selected rinsing solution. The soluble photoresist material is then removed, or "developed," thereby leaving behind a pattern identical to the mask.

Thereafter, gas-phase plasma etching is used to transfer the patterns of the developed photoresist coating to the underlying layers, which may include hard mask, inter-level dielectric (ILD), and/or etch stop layers. Post-plasma etch residues are typically deposited on back-end-of-the-line (BEOL) structures and if not removed, may interfere with subsequent silicidation, proper metallization or contact formation. Post-plasma etch residues typically include chemical elements present on the substrate and in the plasma gases. For example, if a TiN hard mask is employed, e.g. as a metal hard mask over a dielectric hard mask or as a layer over ILD, the post-plasma etch residues include titanium-containing species, which are difficult to remove using conventional wet cleaning chemistries.

In addition to the need to remove post-plasma residues, it is often desirable to remove or partially etch back the metal hard mask such as a titanium-containing hard mask and/or titanium-containing post plasma etch residue, additional materials that are deposited during the post-plasma etch process such as polymeric residues on the sidewalls of the patterned device and copper-containing residues in the open via structures of the device are also preferably removed. No single wet cleaning composition has successfully removed all of residue and/or hard mask material while simultaneously being compatible with the ILD, other low-k dielectric materials, and metal interconnect materials. Compositions in the art claim to act in such a manner but are extremely less effective than the claims indicate.

The integration of new materials, such as low-k dielectrics, into microelectronic devices places new demands on cleaning performance. At the same time, shrinking device dimensions reduces the tolerance for changes in critical dimensions and damage to device elements. Etching conditions can be modified in order to meet the demands of the new materials. Likewise, post-plasma etch cleaning compositions must be modified. Importantly, the cleaner should not damage the underlying dielectric material or corrode metallic interconnect materials, e.g. sensitive ILD materials such as carbon-doped oxides and metal structures such as copper, tungsten, cobalt, aluminum, ruthenium and silicides thereof, on the device.

Typical trench first metal hard mask integration removes the metal hard mask during the chemical mechanical polish process that removes excess device metallurgy. As integration tolerances tighten, the limited ability to correctly fill the defined metal receiving structures has been clearly demonstrated.

Additional complications arise when a self-aligned via (SAV) process that requires enhanced metal hard mask stability is used to provide additional lithographic process window. While it may be beneficial for metal fill to add trapezoidal cross-sectional character to an integration structure, line to line integration space can suffer if an excessive trapezoidal cross-sectional design is used to enhance metal fill of very high aspect structures. A metal hard mask can be designed such that the lithographic transfer into the metal hard mask will define the desired future trench structure and yet be resistant to undesired damage during reactive ion etch transfer operations into the ILD structures such that a metal fill definition structure may be constructed without significant trapezoidal character. An unfortunate byproduct of this aforementioned process is an increase in aspect ratio, which may further impede proper metallization.

What is needed to advance new technologies is a method to improve the aspect ratio for metal deposition while still maintaining the desired line to line integration spaces. U.S. Pat. No. 7,922,824 suggests the use of quaternary ammonium salts and quaternary ammonium alkali as part of a chemical composition for removing metal hard masks and post-plasma etch residues. However, it teaches away from the use of quaternary ammonium salts and quaternary ammonium alkali without the addition of an acid modifying agent, such as citric acid, and by this teaching as well as the direct omission of quaternary ammonium salts in the list of oxidizing agent stabilizers indicates that quaternary ammonium salts and quaternary ammonium alkali cannot be used alone.

SUMMARY OF THE INVENTION

The present invention is a chemical solution that removes undesired metal hard mask yet remains selective to the device wiring metallurgy and dielectric materials. The present invention decreases aspect ratio by removal of the metal hard mask before the metallization of the receiving structures without adverse damage to any existing metal or dielectric materials required to define the semiconductor device, e.g. copper metallurgy or device dielectric.

According to an embodiment of the present invention, a chemical composition for removing a metal hard mask and etching residues from a microelectronic device is provided. The chemical composition includes: an oxidizing agent selected from a group comprised of peroxides and oxidants which do not leave a residue or adversely attack copper; a pH controlling agent selected from a group comprised of quaternary ammonium salts and quaternary ammonium alkali; and an aqueous solution.

According to a further embodiment of the present invention, a method of removing a metal hard mask and etching residues from a microelectronic device is provided. The method includes steps of: etching a trench in an interconnect structure selective to a dielectric capping layer by a reactive ion etching process (RIE); applying a wet chemical composition for removing at least a portion of layers on the interconnect structure selective to the dielectric capping layer, said chemical composition comprising an oxidizing agent selected from a group comprised of peroxides and oxidants which do not leave a residue or adversely attack copper, a pH controlling agent selected from a group comprised of quaternary ammonium salts and quaternary ammonium alkali and an aqueous solution, wherein the composition has a pH in the range of about 7 to about 14; and etching the interconnect structure to open the dielectric capping layer above a copper device layer for filling the trench.

According to another embodiment of the present invention, a method of removing a metal hard mask and etching residues from a microelectronic device is provided. The method includes steps of: etching a trench in an interconnect structure selective to a copper device layer by a reactive ion etching process (RIE); and applying a wet chemical composition for removing at least a portion of layers on the interconnect structure selective to the copper device layer, said chemical composition comprising an oxidizing agent selected from a group comprised of peroxides and oxidants which do not leave a residue or attack copper, a pH controlling agent selected from a group comprised of quaternary ammonium salts and quaternary ammonium alkali and an aqueous solution, wherein the composition has a pH in the range of about 7 to about 14.

BRIEF DESCRIPTION OF THE DRAWINGS

The features and elements of the present invention are set forth with respect to the appended claims and illustrated in the drawings.

FIG. 5C illustrates the fully etched microelectronic device after a full wet strip of the metal hard mask and etch residue according to the present invention.

DETAILED DESCRIPTION OF THE PREFERRED EMBODIMENTS

Figure 1:
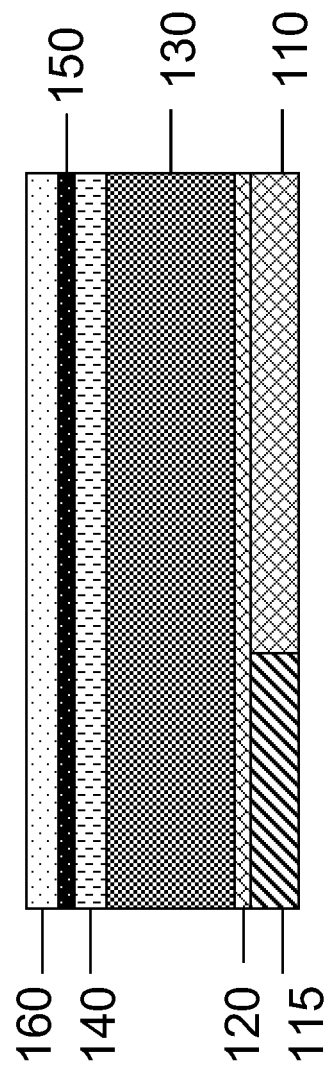
FIG. 1 illustrates a microelectronic device prior to imaging and etching.

The following describes embodiments of the present invention with reference to the drawings. The embodiments are illustrations of the invention, which can be embodied in various forms. The present invention is not limited to the embodiments described below, rather representative for teaching one skilled in the art how to make and use it. Some aspects of the drawings repeat from one drawing to the next. The aspects retain their same numbering from their first appearance throughout each of the preceding drawings.

The present invention is a chemical solution that removes undesired metal hard mask yet remains selective to the device wiring metallurgy and dielectric materials. The present invention decreases aspect ratio by selective removal of the metal hard mask before the metallization of the receiving structures without adverse damage to any existing metal or dielectric materials required to define the semiconductor device, e.g. copper metallurgy or device dielectric. Thus, an improved aspect ratio for metal fill without introducing any excessive trapezoidal cross-sectional character to the defined metal receiving structures of the device will result.

Compositions of the invention may be embodied in a wide variety of specific formulations, as hereinafter more fully described. In all such compositions, wherein specific components of the composition are discussed in reference to weight percentage ranges including a zero lower limit, it will be understood that such components may be present or absent in various specific embodiments of the composition, and that in instances where such components are present, they may be present at concentrations as low as 0.0001 weight percent, based on the total weight of the composition in which such components are employed.

The compositions of the invention may be formulated to substantially remove the titanium-containing residue, the polymeric sidewall reside and/or the copper-containing residue from the surface of the microelectronic device without substantially damaging the underlying inter level dielectric, metal interconnect materials and any dielectric hard mask, if present. The composition may be formulated to remove the metal hard mask layer from the surface of the microelectronic device without substantially damaging the underlying low-k dielectric and metal interconnect materials.

The chemical composition of the present invention includes an oxidizing agent and a pH controlling agent in an aqueous solution. De-ionized water is the principle solvent in the aqueous solution. The solvent must be at least free of any detrimental ions or other materials that could interfere with the cleaning action of the chemical composition or degrade the cleanliness or future performance of the semiconductor circuit. While de-ionized water is the most preferred solvent for the chemical composition, it is understood that other solvent systems with similar salvation properties to de-ionized water may also act as a possible solvent for the present invention. Thus, an aqueous solution is most preferred. However, it is understood that other solvent systems similar to water may also act suitably for the present invention. For example, a 25% isopropanol, 75% de-ionized water solvent system may also produce satisfactory results.

The oxidizing agent is preferably a peroxide, for example hydrogen peroxide and organic peroxides such as benzoyl peroxide. However, oxidizing agents may also include a non-metal with the ability to oxidize titanium nitride (TiN) to a soluble compound without leaving a metallic residue and oxidants that do not leave a residue or adversely attack copper (Cu). It is very important that the oxidant/oxidizing agent, when dissolved in the chemical process, does not attack copper (Cu). For example, an oxidant may have an activity against copper when used without the modifying agents in the present chemical composition. However, when so mixed with the other agents of the present chemical composition, the activity of the oxidant is modified such that copper is not detrimentally attacked. More specifically, the pH may be adjusted such that copper oxidation is minimized, and/or a surface adsorption action may occur due to agents in the present invention such that the copper is protected from oxidation. The tetraethylammonium (TEA) ion may act as a passavating adsorbent on a copper surface at the pH value of the present chemical composition as it is so designed.

The pH stabilizer adjusts the pH level in the chemical composition to a range of about 7 to about 14. Preferably, the pH stabilizer adjusts the pH level to a range of about 9 to about 10. Quaternary ammonium salts and quaternary ammonium alkalis are preferred for use as a pH stabilizer in the present invention. Tetramethylammonium hydroxide (TMAH) is the quaternary ammonium that is primarily used in the industry. However, TMAH is toxic; it causes severe and typically unexpected health problems from exposure. Unlike typical strong bases where an unprotected acute exposure generally results in a caustic burn, TMAH may also introduce a complication of decreased respiratory function. Thus, a quaternary ammonium that does not cause unexpected health side effects is preferable. Tetraethylammonium hydroxide (TEAH) is the most preferred pH stabilizer in the present invention. In addition to the ability to adjust pH without the introduction of extraneous undesirable metal ions, such as alkaline earth or alkali metal ions, the TEA ion may also act as a passavating adsorbent on a copper surface at the pH value of the present chemical composition as it is also designed.

Regardless of whether the passavation action by TEA ions occur, the ability to adjust pH without the introduction of extraneous undesirable metal ions and the decreased hazard of TEAH makes TEAH the most preferred pH stabilizer for the present invention. It is understood that other quaternary ammonium salts may also act as pH stabilizing agents without the additional passavation action towards a copper surface as long as the resultant solution does not have detrimental activity towards a copper surface; such a resultant solution is within the purview of the present invention.

The approximate bath life of the chemical composition is in the range of about 18 hrs to about 22 hrs. When the chemical bath drops below 10-15% fresh bath, the bath is no longer useful. It is understood that typical methods used to extend solution bath life such as replenishment of the consumed oxidizer in a recirculated solution may be used to extend usable bath life. Additionally, it is known that trace contamination such as minute amounts of some metal ions may also dramatically decrease bath life. As such, the chemical composition of the present invention may be of single use (i.e., dispensed on the wafer for cleaning and sent to drain) or multiple use (i.e., reclaimed after initial processing use and stored for additional use). It is recognized that reclamation may decrease the usable life of a reclaimed chemical bath. The use of a sequestering agent (oxidant stabilizer) in the chemical bath can increase the life of the bath during reclamation process use. A sequestering agent may be added to an un-reclaimed chemical composition; this sequestering agent may extend the usable bath life of such a composition beyond that of a solution without the sequestering agent. Through the use of a sequestering agent, the oxidizer concentration may be controlled such that excessive oxidant concentration addition to the chemical composition of the present invention is not necessary to compensate for oxidant consumption by undesired decomposition due to contamination, rather than by the normal consumption that occurs during the desired cleaning action of the present chemical composition. Thereby, the sequestering agent optimizes the concentration to further minimize the chemical composition's attack on the copper device layer by enabling a minimization of required oxidizer concentration in the present chemical composition.

Sequestering agents that can be used in the present invention are amines and amino acids. The preferred sequestering agents are 1,2-cyclohexanediamine-N,N,N',N'-tetraacetic acid (CDTA), ethyenediaminetetraacetic acid (EDTA) and diethylenetriaaminopentaacetic acid (DTPA). The preferential use of complex sequestering agents, such as CDTA, versus a simple sequestering agent, such as EDTA, is based on the possibility of degradation of a simple sequestering agent over time and at extended exposure to certain temperatures. However, it is understood that for some methods of application a simple sequestering agent such as EDTA may be suitable. For example, a single use system where heating occurs just before the solution dispenses on a wafer for chemical cleaning.

For further copper protection, a copper protectant can be added to the chemical composition. The preferred copper protectants for the present invention are hetero-organic inhibitors such as azoles. Preferably, at least one of benzotriazole, 1,2,3 triazole, 1,3,4 triazole, 1,2,4 triazole and imidazole are used in the chemical composition. The use of hetero-organic inhibitors as opposed to simple organic compounds is based on the possibility of degradation of organic compounds over time and at extended exposure to certain temperatures. Azoles are organic compounds containing nitrogen atoms with free electron pairs that are potential sites for bonding with copper and that enable inhibiting action. Also, there is a possibility of introduction of other heteroatoms and groups in molecules of these compounds so there is a wide range of derivatives that exhibit good inhibition characteristics. For example, it is understood that thiols produce active protection on copper surfaces.

Preferred formulations for the chemical composition are:
1. 9% per wt oxidizing agent, 0.8% per wt pH stabilizer, 90.2% aqueous solution;
2. 9% per wt oxidizing agent, 0.8% per wt pH stabilizer, 10 ppm sequestering agent, remainder aqueous solution;
3. 9% per wt oxidizing agent, 0.8% per wt pH stabilizer, 10 ppm sequestering agent, 100 ppm copper protectant, remainder aqueous solution.

The preferred formulation of the chemical composition is hydrogen peroxide and TEAH in an aqueous solution, wherein the composition has a pH in the range of about 9 to about 10. The chemical composition is designed to remove at least some titanium nitride (TiN). However, the chemical composition is also intended to remove at least some etching residues. Accordingly, it is intended to be a full clean. It is understood that in some cases a full clean by a single solution may be too aggressive and a sequential clean using multiple chemical systems may be less aggressive with respect to copper or sensitive ILD structures. Performing a full clean with a single solution is not to be done at the expense of the copper device layer or sensitive ILD structures.

Figure 2:
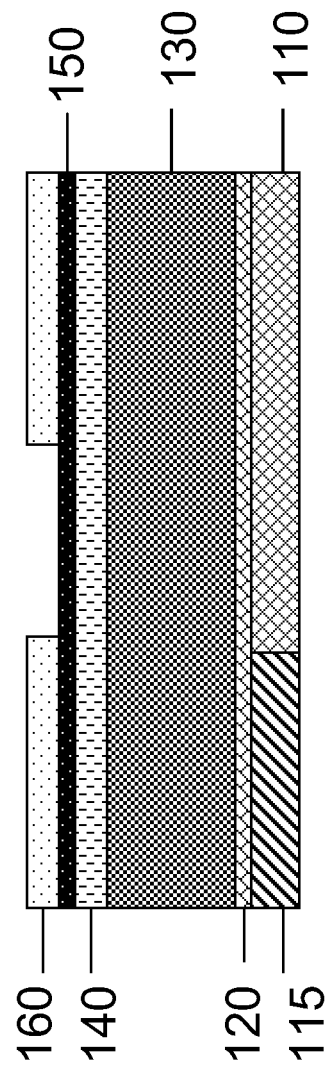
FIG. 2 illustrates the microelectronic device with an imaged lithographic stack.
Figure 3:
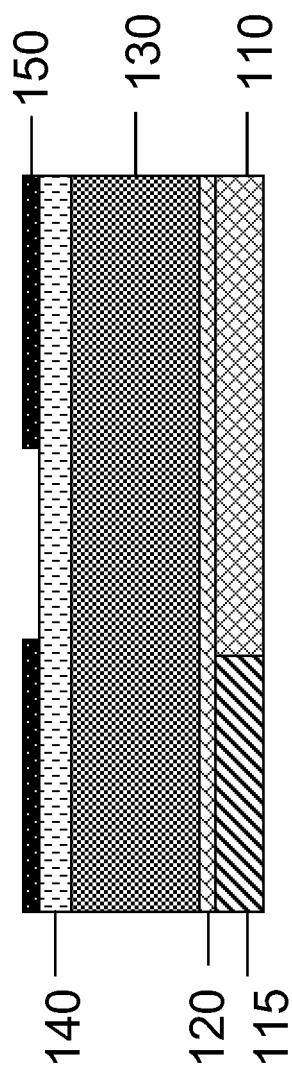
FIG. 3 illustrates the microelectronic device after removal of the lithographic stack and etched metal hard mask.

The chemical composition can be applied to a microelectronic device in multiple ways. Referring now to FIG. 1, the microelectronic device may include protective layers including a lithographic stack layer 160, a metal hard mask layer 150, such as titanium nitride, a dielectric hard mask layer 140, such as tetraethyl orthosilicate (TEOS), an inter-level dielectric 130, and a dielectric capping layer 120, such as NBlock, above a copper device layer (copper line) 110 and another inter-level dielectric 115. Prior to application of the chemical composition, the lithographic stack layer 160 is imaged, as shown in FIG. 2, creating an opening in the lithographic stack layer 160 exposing a portion of the metal hard mask 150. In FIG. 3, the lithographic stack layer 160 is removed during etch of metal hard mask layer 150. The metal hard mask layer 150 is etched in such a way as to create an opening thus exposing a portion of the dielectric hard mask layer 140. Another etch is performed for forming a trench in the microelectronic device. The etching processes are most likely a reactive ion etching. The etching process often leaves a residue on the microelectronic device and the protective layers, as well as leaving a portion of the protection layers intact.

Figure 4A:
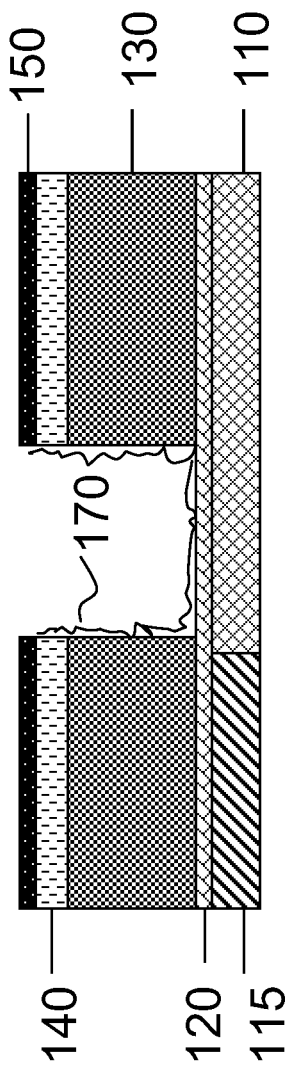
FIG. 4A illustrates the microelectronic device post reactive ion etch selective to the dielectric cap (partial RIE) with etch residue according to the present invention.
Figure 4B:
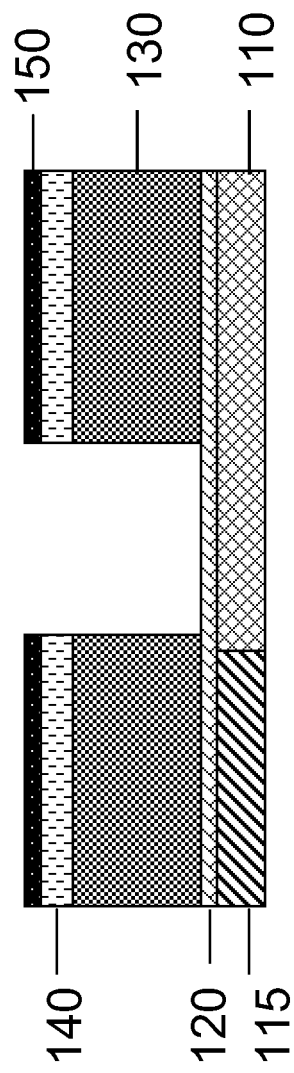
FIG. 4B illustrates the microelectronic device post reactive ion etch selective to the dielectric cap (partial RIE) without etch residue according to the present invention.

In one embodiment of the present invention, the etching process forms the trench down to the dielectric capping layer 120, as shown in FIGS. 4A-4D. This is called a partial etch. The dielectric capping layer 120 is left in this embodiment of the present invention as a barrier for the copper device layer to protect against the wet etching process, that is, application of the chemical composition of the present invention. FIG. 4A shows the microelectronic device after a partial etch with residual etch residue 170. FIG. 4B shows the microelectronic device after a partial etch without the residual etch residue for clarity. Likewise, the residue is removed from FIGS. 4C-4E for clarity.

Figure 4C:
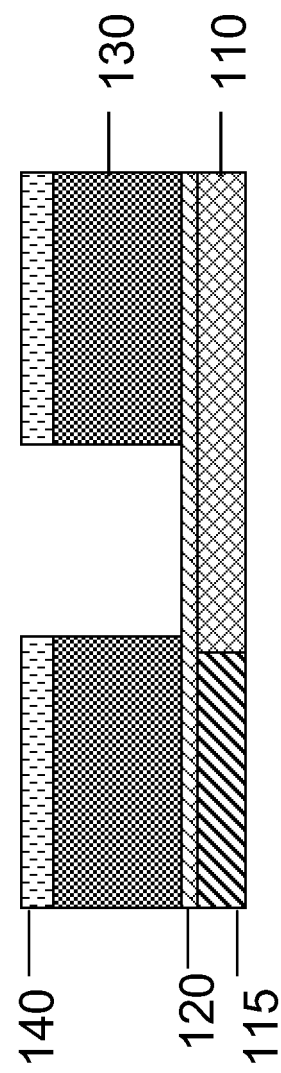
FIG. 4C illustrates the partially etched microelectronic device after a full wet strip of the metal hard mask and etch residue according to the present invention.

FIG. 4C shows the microelectronic device after a full wet etch process, that is, after application of the chemical composition of the present invention removing the entire metal hard mask layer 150. The chemical composition is applied to the microelectronic device at a temperature in the range of about 25° C. to about 80° C. Preferably, the chemical composition is applied at about 60° C. For total removal, the chemical composition is applied to the microelectronic device for about 1 minute to about 5 minutes.

It has been observed that there is a pattern density relationship to the wet removal of metal hard masks such as titanium nitride (TiN). This is not surprising based both on the incoming variation induced by prior reactive ion etch operations as well as possible chemical kinetic relationships. It is noted that in dense areas of the microelectronic device, an application of the chemical composition of the present invention for about 2 minutes is sufficient to achieve total removal of a titanium nitride (TiN) metal hard mask with a deposited thickness of about 300 A to about 400 A. Whereas, in blanket areas of the microelectronic device, the chemical composition is applied for about 4 minutes to achieve total removal. Total removal would remove all layers above the dielectric hard mask or inter-level dielectric layer if no dielectric hard mask layer is present.

Figure 4D:
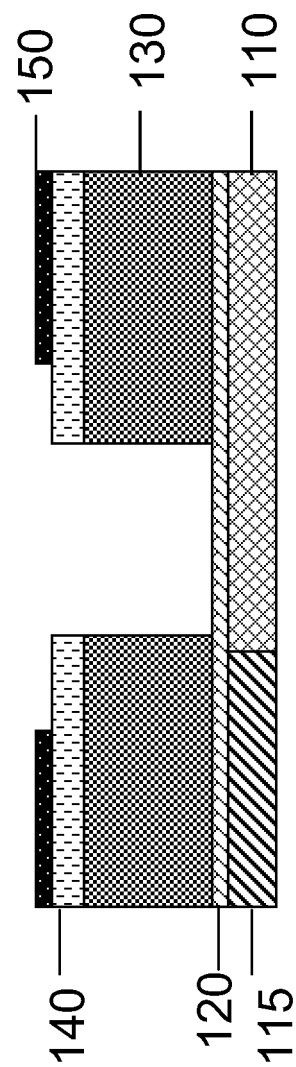
FIG. 4D illustrates the partially etched microelectronic device after a partial wet strip of the metal hard mask and etch residue according to the present invention.
Figure 4E:
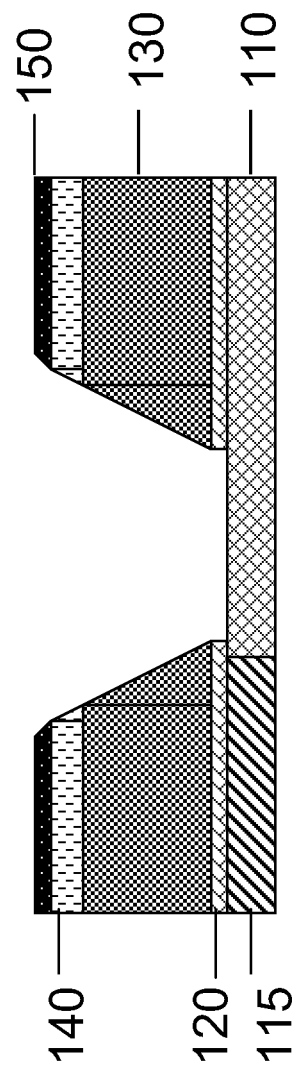
FIG. 4E illustrates the partially etched microelectronic device post final reactive ion etch chamfer and clean according to the present invention.

A partial wet etch process can be performed as opposed to a total wet etch process as shown in FIG. 4D. A partial wet etch would clean and taper at least a part of the microelectronic device for future metallization of the device, which would help the aspect ratio of the device and as such improve metallization. In FIG. 4D, a portion of the metal hard mask layer 150 is removed after the partial wet etch process exposing a portion of dielectric hard mask 140. This helps to mitigate any potential damage to the copper device layer 110. In order to perform a partial etch, the chemical composition is applied for about 1 minute to about 2 minutes at about 60° C. The wet etch, whether total or partial, is followed by an etching process to open the dielectric capping layer 120 and perform any additional tapering/hard mask chamfering necessary as shown in FIG. 4E. A cleaning process may also be performed after the etching process to remove any additional residues from the etching process.

Figure 5A:
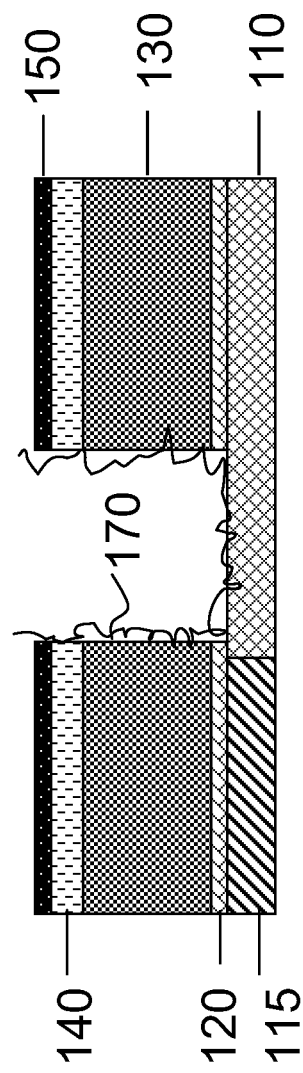
FIG. 5A illustrates the microelectronic device post reactive ion etch selective to the copper line (full RIE) with etch residue.
Figure 5B:
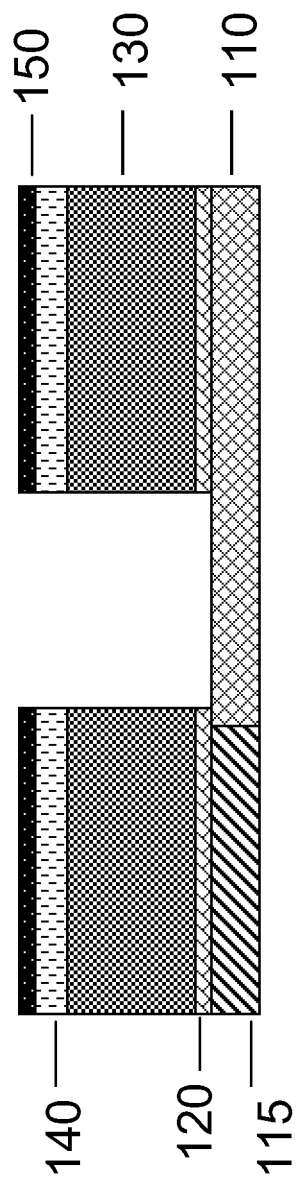
FIG. 5B illustrates the microelectronic device post reactive ion etch selective to the copper line (full RIE) without etch residue.

FIGS. 5A-5E show another embodiment of the present invention where the trench etching process forms the trench down to the copper device layer 110. FIG. 5A shows the microelectronic device after a full etch with residual etch residue 170. FIG. 5B shows the microelectronic device after a full etch without the residual etch residue for clarity. Likewise, the residue is removed from FIGS. 5C-5E for clarity.

FIG. 5C shows the microelectronic device after a full wet etch process, that is, after application of the chemical composition of the present invention removing the entire metal hard mask 150. The chemical composition is applied to the microelectronic device at a temperature in the range of about 25° C. to about 80° C. Preferably, the chemical composition is applied at about 60° C. For total removal, the chemical composition is applied to the microelectronic device for about 1 minute to about 5 minutes. Total removal would remove the entire metal hard mask layer above the dielectric hard mask or inter-level dielectric layer if no dielectric hard mask layer is present.

It has been observed that there is a pattern density relationship to the wet removal of metal hard masks such as titanium nitride (TiN). This is not surprising based both on the incoming variation induced by prior reactive ion etch operations as well as possible chemical kinetic relationships. It is noted that in dense areas of the microelectronic device, an application of the chemical composition of the present invention for about 2 minutes is sufficient to achieve total removal of a titanium nitride (TiN) metal hard mask with a deposited thickness of about 300 A to about 400 A. Whereas, in blanket areas of the microelectronic device, the chemical composition is applied for about 4 minutes to achieve total removal. Total removal would remove all layers above the dielectric hard mask or inter-level dielectric layer if no dielectric hard mask layer is present. Partial removal would leave some metal hard mask structures, but modify the structures by a partial removal of the structures while preserving all layers below the dielectric hard mask such as the dielectric hard mask or inter-level dielectric layers if no dielectric hard mask layer is present.

Figure 5D:
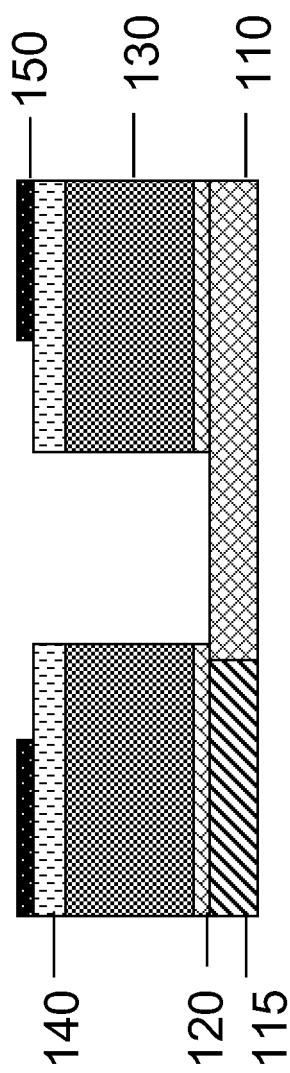
FIG. 5D illustrates the fully etched microelectronic device after a partial wet strip of the metal hard mask and etch residue according to the present invention.
Figure 5E:
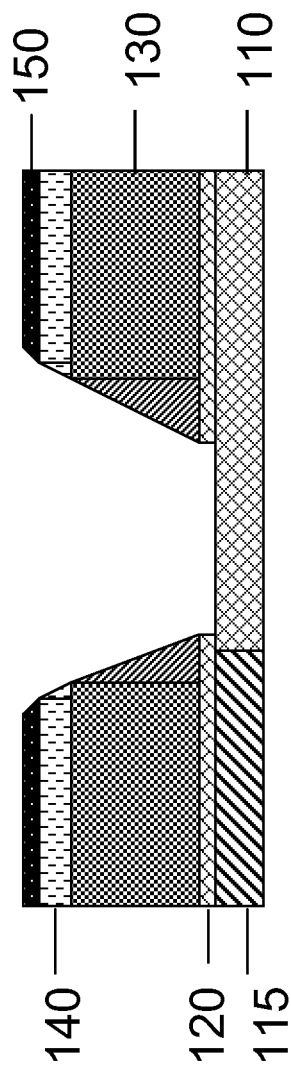
FIG. 5E illustrates the fully etched microelectronic device post final reactive ion etch chamfer and clean according to the present invention.

A partial wet etch process can be performed as opposed to a total wet etch process as shown in FIG. 5D. A partial wet etch would clean and taper the microelectronic device, which would help the aspect ratio of the device. In FIG. 5D, a portion of the metal hard mask layer 150 is removed after the partial wet etch process exposing a portion of dielectric hard mask 140. This helps to mitigate any potential damage to the copper device layer 110. In order to perform a partial etch the chemical composition is applied for about 1 minute to about 2 minutes at about 60° C. The partial wet etch may be followed by an etching process to perform any additional tapering/hard mask chamfering necessary as shown in FIG. 5E. A cleaning process may also be performed after the etching process to remove any additional residues from the etching process.

The chemical composition and its accompanying methods can be used for 64 nm pitch copper single and dual damascene interconnects using pitch split double patterning scheme to enable sub 80 nm pitch patterning, for example. After the trench pattern is formed, the trenches are to be filled with metal. The metallization process has become a challenge for recent technology generations with narrow width trenches patterned in low-k dielectric material with hard masks on top of the dielectric film. The trenches often have a high aspect ratio with undercut under the hard mask. To prevent metal fill defects, the metal hard mask can be removed using the chemical composition of the present invention using one of the methods described herein. This will significantly improve the metal fill process.

Trapezoidal structures in FIGS. 4E and 5E are exaggerated to illustrate possible chamfering of a structure by selective design, not by the lack of degrees of freedom to time a desired sidewall angle. A sidewall angle approximating 90 degrees to the copper plane may be constructed using the present invention. However, the present invention enables the construction of a trapezoidal cross-section, if such a structure is desired. A main difference is that this construction of a trapezoidal cross-section is by conscious design, rather than by an uncontrolled process side effect.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. It is well known that different deposition conditions may result in metal films such as titanium nitride (TiN) hard mask films with different properties. Accordingly, the chemical ratios and/or contact times may be adjusted to produce similar results with varying titanium nitride (TiN) or other metal hard mask films. Thus, the description of the present invention has been presented for purposes of illustration and description, but is not intended to be exhaustive or limited to the invention in the form disclosed.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method of removing a metallic hard mask and etching residues from a microelectronic device comprising steps of:
   providing a material stack of from, bottom to top, a dielectric capping layer, an interlevel dielectric, a dielectric hard mask, a metallic hard mask, and a patterned photoresist having at least one opening that exposes a portion of the upper surface of said metallic hard mask;
   transferring the at least one opening into said metallic hard mask, stopping on said dielectric hard mask by etching, wherein during said etching an entirety of said patterned photoresist is removed, while maintaining metallic hard mask portions on said dielectric hard mask;
   extending said at least one opening through said dielectric hard mask, into said interlevel dielectric material and stopping on said dielectric capping layer by a reactive ion etching process (RIE);
   applying a wet chemical composition removing at least a portion of said metallic hard mask portions from a topmost surface of said dielectric hard mask layer, said chemical composition comprising an oxidizing agent selected from the group consisting of peroxides and oxidants, a pH controlling agent selected from the group consisting of quaternary ammonium salts and quaternary ammonium alkali, and an aqueous solution, wherein the composition has a pH in the range of about 7 to about 14; and
   etching the material stack to open the dielectric capping layer above a copper device layer for filling the at least one opening.

2. The method of claim 1, wherein the wet chemical composition removes an entirety of said metallic hard mask portions selective to the dielectric hard mask by applying the composition in a range from about 1 minute to about 5 minutes at a temperature in the range of about 25° C. to about 80° C.

3. The method of claim 2, wherein the wet chemical composition is applied for about 2 minutes at a temperature of about 60° C.

4. The method of claim 2, wherein the wet chemical composition is applied for about 4 minutes at a temperature of about 60° C.

5. The method of claim 1, wherein the wet chemical composition partially removes said metallic hard mask portions selective to the dielectric hard mask by applying the composition in a range from about 1 minute to about 2 minutes at a temperature of about 60° C.

6. A method of removing a metallic hard mask and etching residues from a microelectronic device comprising steps of:
   providing a material stack of from, bottom to top, an interlevel dielectric, a dielectric hard mask, a metallic hard mask, and a patterned photoresist having at least one opening that exposes a portion of the upper surface of said metallic hard mask;
   transferring the at least one opening into said metallic hard mask, stopping on said dielectric hard mask by etching, wherein during said etching an entirety of said patterned photoresist is removed, while maintaining metallic hard mask portions on said dielectric hard mask;
   extending said at least one opening through said dielectric hard mask and into said interlevel dielectric material by a reactive ion etching process (RIE); and
   applying a wet chemical composition removing at least a portion of said metallic hard mask portions from a topmost surface of said dielectric hard mask, said chemical composition comprising an oxidizing agent selected from the group consisting of peroxides and oxidants, a pH controlling agent selected from the group consisting of quaternary ammonium salts and quaternary ammonium alkali, and an aqueous solution, wherein the composition has a pH in the range of about 7 to about 14.

7. The method of claim 6, wherein the wet chemical composition removes an entirety of said metallic hard mask portions selective to the dielectric hard mask by applying the composition in a range from about 1 minute to about 5 minutes at a temperature in the range of about 25° C. to about 80° C.

8. The method of claim 7, wherein the wet chemical composition is applied for about 2 minutes at a temperature of about 60° C.

9. The method of claim 7, wherein the wet chemical composition is applied for about 4 minutes at a temperature of about 60° C.

10. The method of claim 6, wherein the wet chemical composition partially removes said metallic hard mask portions selective to the dielectric hard mask by applying the composition in a range from about 1 minute to about 2 minutes at a temperature of about 60° C.

11. The method of claim 10, further comprising etching the interconnect structure to further open material layers above an underlying copper device layer for filling the at least one opening.

12. The method of claim 6, wherein said wet chemical composition is selected from the group consisting essentially of said oxidizing agent, said pH stabilizer agent, and said aqueous solution.

13. The method of claim 6, wherein said peroxide is hydrogen peroxide.

14. The method of claim 6, wherein said wet chemical composition comprises 1.9% of said oxidizing agent, 0.8% of said pH controlling agent, and 90.2% of said aqueous solution.

15. The method of claim 6, wherein said wet chemical composition comprises 2.9% of said oxidizing agent, 0.8% of said pH controlling agent, 10 ppm of a sequestering agent, and the remainder said aqueous solution.

16. The method of claim 6, wherein said wet chemical composition comprises 3.9% of said oxidizing agent, 0.8% of said pH controlling agent, 10 ppm of a sequestering agent, 100 ppm of a copper protectant and the remainder said aqueous solution.

17. A method of removing a metallic hard mask and etching residues from a microelectronic device comprising steps of:
    providing a material stack of from, bottom to top, an interlevel dielectric, a dielectric hard mask, a metallic hard mask, and a patterned photoresist having at least one opening that exposes a portion of the upper surface of said metallic hard mask;
    transferring the at least one opening into said metallic hard mask, stopping on said dielectric hard mask by etching, wherein during said etching an entirety of said patterned photoresist is removed, while maintaining metallic hard mask portions on said dielectric hard mask;
    extending said at least one opening through said dielectric hard mask and into said interlevel dielectric material by a reactive ion etching process (RIE); and
    applying a wet chemical composition removing at least a portion of said metallic hard mask portions from a topmost surface of said dielectric hard mask, said chemical composition consisting essentially of an oxidizing agent selected from the group consisting of a peroxide, a pH controlling agent selected from the group consisting of quaternary ammonium salts and quaternary ammonium alkali, and an aqueous solution, wherein the composition has a pH in the range of about 7 to about 14.

18. The method of claim 17, wherein said wet chemical composition consists of said oxidizing agent, said pH controlling agent, and said aqueous solution.

19. The method of claim 18, wherein said peroxide is hydrogen peroxide.

20. The method of claim 19, wherein said wet chemical composition comprises 1.9% of said oxidizing agent, 0.8% of said pH controlling agent, and 90.2% of said aqueous solution.

21. The method of claim 17, wherein said wet chemical composition comprises 2.9% of said oxidizing agent, 0.8% of said pH controlling agent, 10 ppm of a sequestering agent, and the remainder said aqueous solution.

22. The method of claim 17, wherein said wet chemical composition comprises 3.9% of said oxidizing agent, 0.8% of said pH controlling agent, 10 ppm of a sequestering agent, 100 ppm of a copper protectant and the remainder said aqueous solution.

\* \* \* \* \*